(12) United States Patent
Zhai et al.

(10) Patent No.: US 10,319,753 B2
(45) Date of Patent: Jun. 11, 2019

(54) ARRAY SUBSTRATE, DISPLAY PANEL AND DISPLAY DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Yingteng Zhai, Shanghai (CN); Feng Lu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/466,885

(22) Filed: Mar. 23, 2017

(65) Prior Publication Data
US 2017/0194364 A1 Jul. 6, 2017

(30) Foreign Application Priority Data
Nov. 23, 2016 (CN) .......................... 2016 1 1040543

(51) Int. Cl.
*H01L 27/12* (2006.01)
*H01L 23/367* (2006.01)
(Continued)

(52) U.S. Cl.
CPC ...... *H01L 27/1255* (2013.01); *G02F 1/13338* (2013.01); *G02F 1/133305* (2013.01);
(Continued)

(58) Field of Classification Search
CPC .............. H01L 27/3276; H01L 27/323; H01L 27/3288; H01L 27/3297; H01L 23/34;
(Continued)

(56) References Cited

U.S. PATENT DOCUMENTS

| 9,721,901 B2 * | 8/2017 | Ryu ...................... H01L 23/544 |
| 2008/0011095 A1 * | 1/2008 | Bloom ...................... G01L 1/20 |
| | | 73/819 |

(Continued)

FOREIGN PATENT DOCUMENTS

| CN | 103268885 A | 8/2013 |
| CN | 104866134 A | 8/2015 |

*Primary Examiner* — David C Spalla
(74) *Attorney, Agent, or Firm* — Kilpatrick Townsend & Stockton LLP

(57) ABSTRACT

An array substrate, a display panel and a display device are provided. The array substrate includes a display region and a frame region surrounding the display region. The frame region includes multiple bridge pressure sensing units and multiple first heat conductive sheets. Each of the multiple bridge pressure sensing units includes a bridge electrode, a first power supply line electrically connected to a power supply terminal of the bridge electrode, and a detection line electrically connected to a detection terminal of the bridge electrode. Each of the multiple first heat conductive sheets is arranged opposite to the bridge electrode, and a vertical projection of the first heat conductive sheet on the bridge electrode covers the bridge electrode.

19 Claims, 7 Drawing Sheets

(51) Int. Cl.
*G02F 1/1333* (2006.01)
*G06F 3/041* (2006.01)
*G06F 3/044* (2006.01)
*H01L 23/40* (2006.01)

(52) U.S. Cl.
CPC ............ *H01L 27/124* (2013.01); *G06F 3/044* (2013.01); *G06F 3/0412* (2013.01); *H01L 2023/4068* (2013.01)

(58) Field of Classification Search
CPC ... G01L 1/23; G01L 1/205; G02F 3/041–047; G06F 2203/04105
See application file for complete search history.

(56) References Cited

U.S. PATENT DOCUMENTS

| | | | |
|---|---|---|---|
| 2014/0166994 A1 | 6/2014 | Xiong et al. | |
| 2016/0103545 A1* | 4/2016 | Filiz | G01L 1/18 345/174 |
| 2016/0162093 A1* | 6/2016 | Kim | G06F 3/0412 345/174 |
| 2017/0329448 A1* | 11/2017 | Li | G06F 3/0412 |

* cited by examiner

ARRAY SUBSTRATE, DISPLAY PANEL AND DISPLAY DEVICE

CROSS REFERENCE TO RELATED APPLICATION

The present application claims the priority to Chinese Patent Application No. 201611040543.1, titled "ARRAY SUBSTRATE, DISPLAY PANEL AND DISPLAY DEVICE", filed on Nov. 23, 2016 with the State Intellectual Property Office of the PRC, which is incorporated herein by reference in its entirety.

TECHNICAL FIELD

The present disclosure relates to the field of display technology, and in particular to an array substrate, a display panel and a display device.

BACKGROUND

With the continuous development of display technology, display panels are applied more and more widely, and requirements on function and appearance of the display panel by users also become increasingly diverse. To meet the requirements of users, flexible display panels have been developed. The flexible display panel has the characteristic of being variable and bendable. In basis of the characteristic, researchers try to integrate a pressure sensing function into the flexible display panel.

In the conventional technology, the method for integrating the pressure sensing function into the flexible display panel is generally to arrange one or more bridge electrodes, formed by four resistors connected in a form of Wheatstone bridge, on an array substrate of the flexible display panel. In a case that the flexible display panel is subjected to external pressure, resistances of the four resistors of the bridge electrode are changed, and a pressure sensing circuit connected to the one or more bridge electrodes transforms the change in the resistances into a value of the external pressure subjected by the flexible display panel.

In the method for integrating the pressure sensing function into the flexible display panel, the resistance of each of the four resistors of the bridge electrode is quite sensitive to temperature, thus, the temperature is changed due to a large amount of heat generated during operation of the display panel. If the temperatures of the regions corresponding to the four resistors of the bridge electrode are not uniform, an output voltage of the bridge electrode may be inaccurate, which causes the error in the pressure detection.

SUMMARY

In view of the above, an array substrate, a display panel and a display device are provided according to the present disclosure. A first heat conductive sheet is arranged opposite to a region where a bridge electrode is arranged, and a vertical projection of the first heat conductive sheet on the bridge electrode covers the bridge electrode. Since the heat conductivity of the first heat conductive sheet makes heat distribution of the first heat conductive sheet uniform, and further makes the temperature distribution of the region corresponding to the bridge electrode uniform, the influence of the non-uniform temperature on the output voltage of the bridge electrode is reduced, and a high accuracy of the pressure detection of the display device is ensured.

To achieve the above objects, the following technical solutions are provided according to the present disclosure.

An array substrate is provided according to the present disclosure. The array substrate includes a display region and a frame region surrounding the display region. The frame region includes multiple bridge pressure sensing units and multiple first heat conductive sheets. Each of the multiple bridge pressure sensing units includes a bridge electrode, a first power supply line electrically connected to a power supply terminal of the bridge electrode, and a detection line electrically connected to a detection terminal of the bridge electrode. Each of the multiple first heat conductive sheets is arranged opposite to the bridge electrode, and a vertical projection of the first heat conductive sheet on the bridge electrode covers the bridge electrode.

Correspondingly, a display panel is further provided according to the present disclosure. The display panel includes the above array substrate.

Based on the display panel and the array substrate according to the present disclosure, a display device is further provided according to the present disclosure. The display device includes the above display panel.

Compared with the conventional technology, the technical solutions according to the present disclosure have at least the following advantages.

An array substrate, a display panel and a display device are provided according to the present disclosure. The array substrate includes the display region and the frame region surrounding the display region. The frame region includes multiple bridge pressure sensing units and multiple first heat conductive sheets. Each of the multiple bridge pressure sensing units includes the bridge electrode, the first power supply line electrically connected to the power supply terminal of the bridge electrode, and the detection line electrically connected to the detection terminal of the bridge electrode. Each of the multiple first heat conductive sheets is arranged opposite to the bridge electrode, and the vertical projection of the first heat conductive sheet on the bridge electrode covers the bridge electrode.

As can be seen from the above that, based on the technical solutions according to the present disclosure, the first heat conductive sheet is arranged opposite to a region where the bridge electrode is arranged, and the vertical projection of the first heat conductive sheet on the bridge electrode covers the bridge electrode. Since the heat conductivity of the first heat conductive sheet makes heat distribution of the first heat conductive sheet uniform, and further makes the temperature distribution of the region corresponding to the bridge electrode uniform, the influence of the non-uniform temperature on the output voltage of the bridge electrode is reduced, and a high accuracy of the pressure detection of the display device is ensured.

BRIEF DESCRIPTION OF THE DRAWINGS

To illustrate technical solutions according to embodiments of the present disclosure or in the conventional technologies more clearly, drawings to be used in the descriptions of the embodiments or the conventional technologies are described briefly hereinafter. Apparently, the drawings described hereinafter are only for some embodiments of the present disclosure, and other drawings may be obtained by those skilled in the art based on those drawings without creative efforts.

DETAILED DESCRIPTION OF THE EMBODIMENTS

Technical solutions of the embodiments of the present disclosure are illustrated clearly and completely in conjunction with the drawings of the embodiments of the present disclosure. Apparently, the described embodiments are merely a few rather than all of the embodiments of the present disclosure. All other embodiments obtained by those skilled in the art based on the embodiments of the present disclosure without creative efforts shall fall within the protection scope of the present disclosure.

As described in the background part, in the method for integrating the pressure sensing function into the flexible display panel, the resistance of each of the resistors of the bridge electrode is quite sensitive to temperature. Thus, the temperature is changed due to a large amount of heat generated during operation of the display panel. If the temperatures of the regions corresponding to four resistors of the bridge electrode are not uniform, an output voltage of the bridge electrode may be inaccurate, which causes the error in the pressure detection.

On the basis of the above, an array substrate, a display panel and a display device are provided according to embodiments of the present disclosure. A first heat conductive sheet is arranged opposite to a region where a bridge electrode is arranged, and a vertical projection of the first heat conductive sheet on the bridge electrode covers the bridge electrode. Since the heat conductivity of the first heat conductive sheet makes heat distribution of the first heat conductive sheet uniform, and further makes the temperature distribution of the region corresponding to the bridge electrode uniform, the influence of the non-uniform temperature on the output voltage of the bridge electrode is reduced, and a high accuracy of the pressure detection of the display device is ensured. To achieve the above objects, the following technical solutions are provided according to the embodiments of the present disclosure. Specifically, the technical solutions according to the embodiments of the present disclosure will be described in detail in conjunction with FIG. 1 to FIG. 7.

Figure 1A:
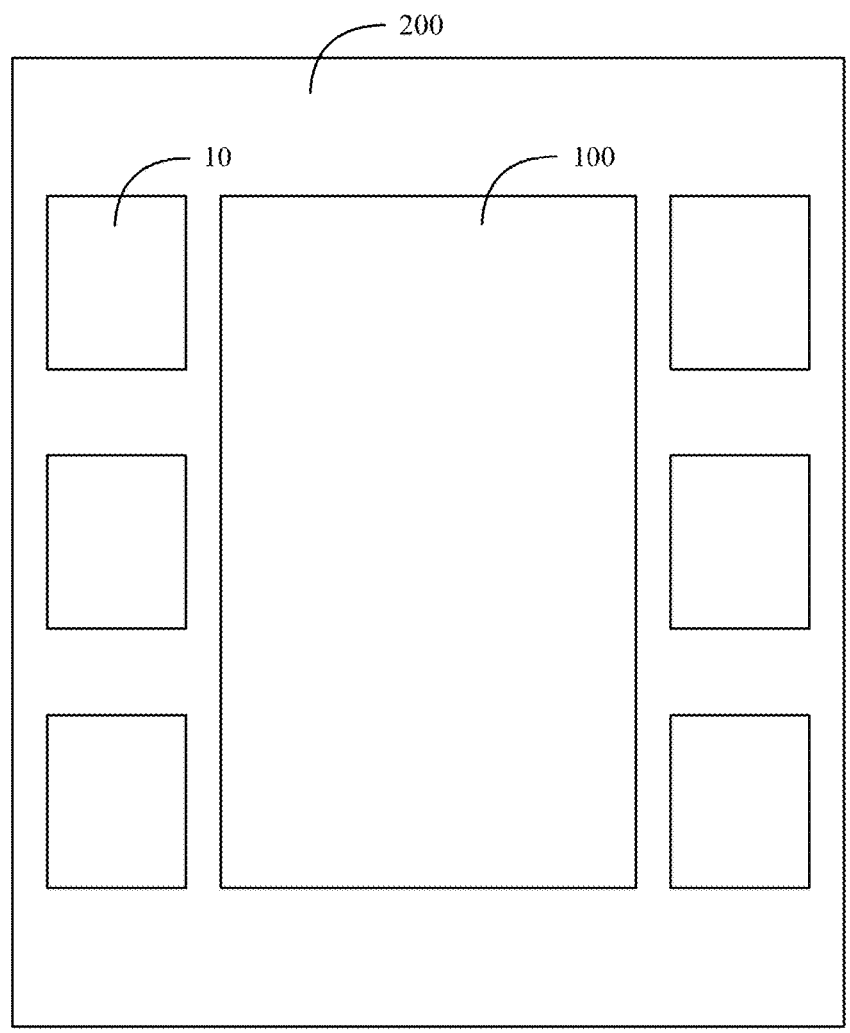
FIG. 1a is a schematic structural diagram of an array substrate according to an embodiment of the present disclosure.
Figure 1B:
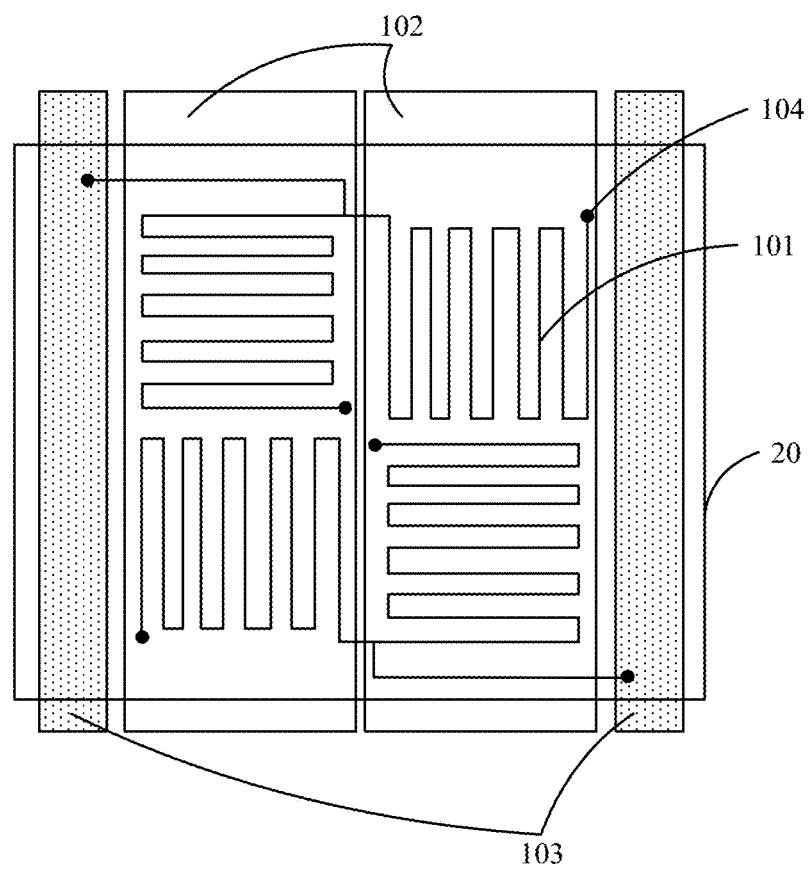
FIG. 1b is a schematic structural diagram of a bridge pressure sensing unit and a first heat conductive sheet according to an embodiment of the present disclosure.

Reference is made to FIG. 1a and FIG. 1b. FIG. 1a is a schematic structural diagram of an array substrate according to an embodiment of the present disclosure. FIG. 1b is a schematic structural diagram of a bridge pressure sensing unit and a first heat conductive sheet according to an embodiment of the present disclosure. The array substrate includes a display region 100 and a frame region 200 surrounding the display region 100. The frame region 200 includes multiple bridge pressure sensing units 10 and multiple first heat conductive sheets 20. Each of the multiple bridge pressure sensing units 10 includes a bridge electrode 101, a first power supply line 102 electrically connected to a power supply terminal of the bridge electrode 101, and a detection line 103 electrically connected to a detection terminal of the bridge electrode 101. Each of the multiple first heat conductive sheets 20 is arranged opposite to the bridge electrode 101, and a vertical projection of the first heat conductive sheet 20 on the bridge electrode 101 covers the bridge electrode 101. Since the heat conductivity of the first heat conductive sheet 20 makes heat distribution of the first heat conductive sheet 20 uniform, and further makes the temperature distribution of the region corresponding to the bridge electrode 101 uniform, the influence of the non-uniform temperature on the output voltage of the bridge electrode 101 is reduced, and a high accuracy of the pressure detection of the display device is ensured.

Reference is made to FIG. 1b, the bridge electrode 101 according to the embodiment of the present disclosure is formed by four resistors connected in a form of Wheatstone bridge. Therefore, the power supply terminal of the bridge electrode 101 actually includes two sub-terminals, which are a positive power supply terminal and a negative power supply terminal. The detection terminal of the bridge electrode 101 also includes two sub-terminals, which are a positive output terminal and a negative output terminal. That is, the first power supply line 102 according to the embodiment of the present disclosure actually includes two power supply sub-lines, which are respectively connected to the positive power supply terminal and the negative power supply terminal, and the detection line 103 actually includes two detection sub-lines, which are respectively connected to the positive output terminal and the negative output terminal. The structure and the pressure sensing principles are the same as those in the conventional technology, which are not described herein.

In one embodiment of the present disclosure, reference is made to FIG. 1b. Each of the first power supply line 102 and the detection line 103 is arranged at a layer different from a layer where the bridge electrode 101 is arranged, and is arranged opposite to the bridge electrode 101. Each of the first power supply line 102 and the detection line 103 is electrically connected to the bridge electrode 101 via a through-hole 104, and vertical projections of the first power supply line 102 and the detection line 103 on the bridge electrode 101 cover the bridge electrode 101 to the maximum extent, which further makes the temperature distribution of the region corresponding to the bridge electrode 101 uniform, and reduces the influence of the non-uniform temperature on the output voltage of the bridge electrode 101. Therefore, a high accuracy of the pressure detection of the display device is ensured.

It should be noted that, the meaning of the vertical projections of the first power supply line 102 and the detection line 103 on the bridge electrode 101 covering the bridge electrode 101 to the maximum extent is described below. The first power supply line 102 and the detection line 103 extend in the same direction, and each of the first power supply line 102 and the detection line 103 includes two signal sub-lines, and the four signal sub-lines of the first power supply line 102 and the detection line 103 are isolated from each other. Therefore, gaps exist between the four signal sub-lines. In the case that basic circuit design requirements are satisfied, the gaps are minimized, and the widths of the four signal sub-lines are maximized to achieve the object of covering the bridge electrode 101. The first power supply line 102 and the detection line 103 according to the present disclosure may be arranged at different layers. In addition, in one embodiment of the present disclosure, preferably, the first power supply line 102 and the detection line 103 are arranged at the same layer. That is, the first power supply line 102 and the detection line 103 are formed by the same conductive film layer so as to avoid occupying more conductive film layers.

Figure 2:
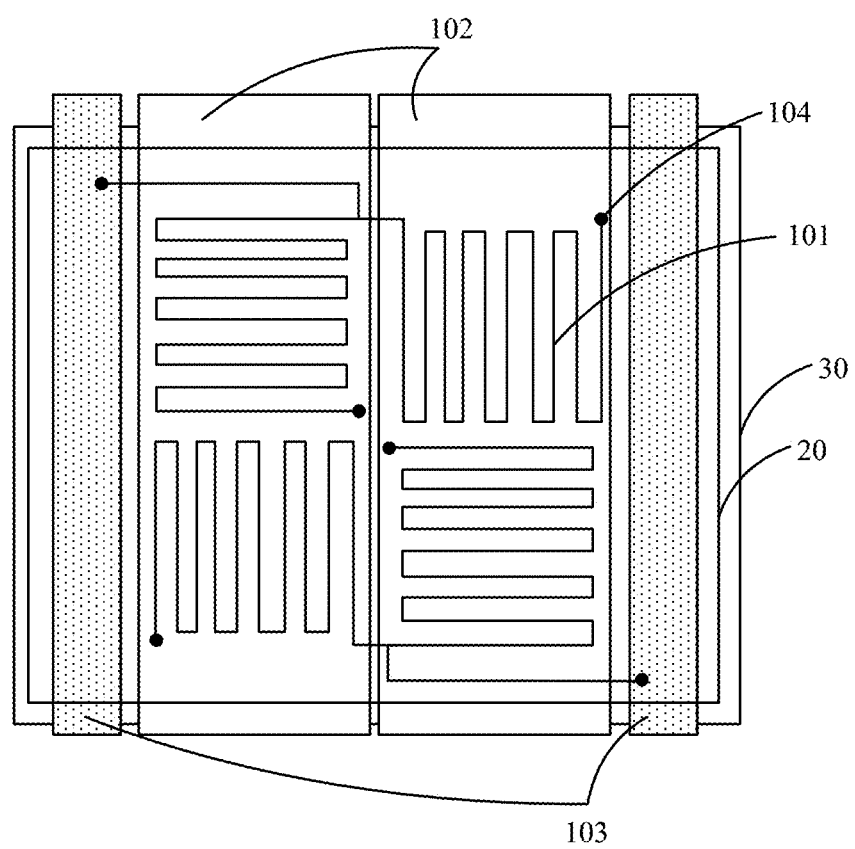
FIG. 2 is a schematic structural diagram of a bridge pressure sensing unit and a heat conductive sheet according to an embodiment of the present disclosure.

Further, in order to better eliminate the influence of the non-uniform temperature on the output voltage of the bridge electrode 101, the array substrate according to an embodiment of the present disclosure may further include a second heat conductive sheet arranged opposite to the bridge electrode 101. Reference is made to FIG. 2, which is a schematic structural diagram of a bridge pressure sensing unit and a heat conductive sheet according to an embodiment of the present disclosure. The frame region further includes multiple second heat conductive sheets 30. Each of the multiple second heat conductive sheets 30 is arranged at a layer different from a layer where the bridge electrode 101 is arranged, and arranged on a side of the bridge electrode 101 away from the first heat conductive sheets 20. A vertical projection of each of the multiple second heat conductive sheets 30 on the bridge electrode 101 covers the bridge electrode 101.

It should be noted that, an upper and lower hierarchical relationship between the first heat conductive sheet 20 and the second heat conductive sheet 30 is not specifically limited to one embodiment. That is, as seen from a light emitting direction of the display device, the first heat conductive sheet 20 may be arranged above the second heat conductive sheet 30, or may also be arranged below the second heat conductive sheet 30, which should be specifically designed based on practical applications.

As can be seen from the above, based on the technical solutions according to the embodiment of the present disclosure, the first heat conductive sheet is arranged opposite to a region where a bridge electrode is arranged, and the vertical projection of the first heat conductive sheet on the bridge electrode covers the bridge electrode. Since the heat conductivity of the first heat conductive sheet makes heat distribution of the first heat conductive sheet uniform, and further makes the temperature distribution of the region corresponding to the bridge electrode uniform, the influence of the non-uniform temperature on the output voltage of the bridge electrode is reduced, and a high accuracy of the pressure detection of the display device is ensured. In addition, in order to better eliminate the influence of the non-uniform temperature on the output voltage of the bridge electrode, the array substrate according to the embodiment of the present disclosure may further include the second heat conductive sheet arranged opposite to the bridge electrode, and the vertical projection of the second heat conductive sheet on the bridge electrode covers the bridge electrode. By the combined actions of the first heat conductive sheet and the second heat conductive sheet, it is better ensured that the temperature distribution of the region corresponding to the bridge electrode is uniform, and a high accuracy of the pressure detection of the display device is ensured.

In the array substrate according to this embodiment of the present disclosure, the bridge electrode, the first power supply line and the detection line which form the bridge pressure sensing unit, the first heat conductive sheet and the second heat conductive sheet may be obtained by re-forming a film layer on the basis of an original film layer of the array substrate and etching the re-formed film layer. Alternatively, the bridge electrode, the first power supply line, the detection line, the first heat conductive sheet and the second heat conductive sheet are formed by reusing the original film layer of the array substrate. Alternatively, a part of the bridge electrode, the first power supply line, the detection line, the first heat conductive sheet and the second heat conductive sheet are obtained by re-forming a film layer on the basis of the original film layer of the array substrate and etching the re-formed film layer, and the other part of the bridge electrode, the first power supply line, the detection line, the first heat conductive sheet and the second heat conductive sheet are formed by reusing the original film layer of the array substrate, which is not specifically limited in the present disclosure, and is specifically designed based on the practical applications.

Figure 3:
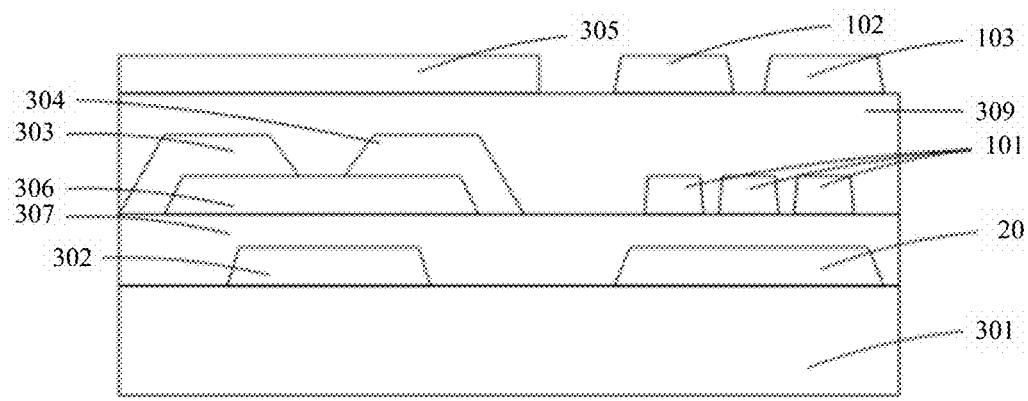
FIG. 3 is a schematic structural diagram of an array substrate according to an embodiment of the present disclosure.
Figure 4:
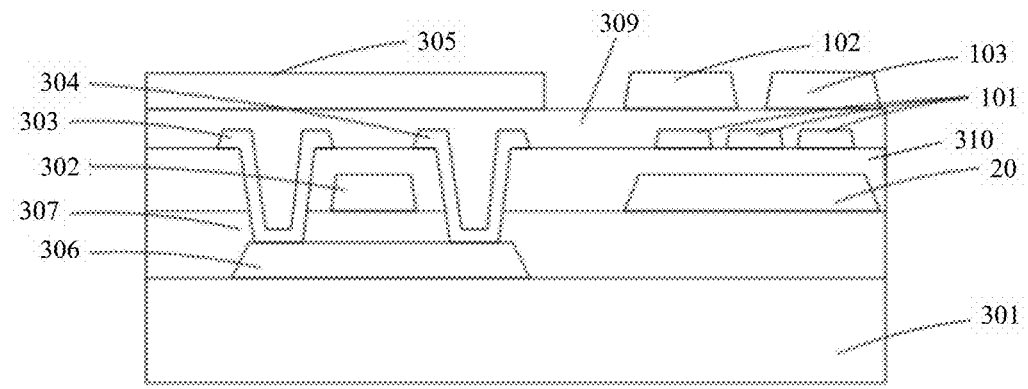
FIG. 4 is a schematic structural diagram of an array substrate according to an embodiment of the present disclosure.

Reference is made to FIG. 3 and FIG. 4. FIG. 3 is a schematic structural diagram of an array substrate according to an embodiment of the present disclosure. FIG. 4 is a schematic structural diagram of an array substrate according to an embodiment of the present disclosure. The array substrate includes a substrate 301, a gate metal layer, a source and drain metal layer and a third metal layer 305. The gate metal layer is arranged on a side of the substrate 301. The gate 302 of a transistor is formed in the gate metal layer. The source and drain metal layer is arranged on a side of the gate metal layer away from the substrate 301, and is arranged to be isolated from the gate metal layer. The source 303 and the drain 304 of the transistor are formed in the source and drain metal layer. The third metal layer 305 is arranged on a side of the source and drain metal layer away from the substrate 301, and is arranged to be isolated from the source and drain metal layer. A planarization layer and/or passivation layer 309 including an organic layer and/or inorganic layer is arranged between the source and drain metal layer and the third metal layer to achieve the insulation and planarization.

It should be noted that, in the array substrate according to the embodiment of the present disclosure, an insulating layer is arranged between each of the conductive layers to make adjacent conductive layers to be insulated and isolated. In addition, the third metal layer 305 may be a common electrode layer or an anode metal layer. That is, in a case that the array substrate is an array substrate of a liquid crystal display device, the third metal layer 305 may be a common electrode layer; or, in a case that the array substrate is an array substrate of an organic electroluminescent display device, the third metal layer 305 may be an anode metal layer.

The array substrate according to one embodiment of the present disclosure may be a bottom gate type array substrate. Reference is made to FIG. 3. The array substrate includes a semiconductor layer 306. The semiconductor layer 306 is arranged between the gate 302 and the source 303 and between the gate 302 and the drain 304, and forms a transistor with the gate 302, the source 303 and the drain 304. That is, the array substrate includes the semiconductor layer 306 arranged between the gate metal layer and the source and drain metal layer, and a gate dielectric layer 307 is arranged between the semiconductor layer 306 and the gate metal layer.

Alternatively, the array substrate according to the embodiment of the present disclosure may be a top gate type array substrate. Reference is made to FIG. 4. The array substrate includes a semiconductor layer 306. The semiconductor layer 306 is arranged on a side of the gate 302 away from the source 303 and the drain 304. That is, the semiconductor layer 306 is arranged between the gate 302 and the substrate 301. That is, the array substrate includes the semiconductor layer 306 arranged between the substrate 301 and the gate metal layer, a gate dielectric layer 307 is arranged between the semiconductor layer 306 and the gate metal layer, and a first insulating layer 310 is arranged between the source and drain metal layer and the gate metal layer.

In the embodiment of the present disclosure, the bridge electrode 101 may be formed by reusing one of the gate metal layer, the source and drain metal layer and the third metal layer, and the first heat conductive sheet 20 may be formed by reusing another one of the gate metal layer, the source and drain metal layer and the third metal layer other than the metal layer reused to form the bridge electrode 101. And the first power supply line 102 and the detection line 103 may be formed by reusing one of the gate metal layer, the source and drain metal layer and the third metal layer other than the metal layer reused to form the bridge electrode 101 and the layer reused to form the first heat conductive sheet 20. Specifically, in conjunction with the array substrate as shown in FIG. 3 and FIG. 4, the first heat conductive sheet 20 may be formed by reusing the gate metal layer, that is, the first heat conductive sheet 20 is arranged at the same metal layer as the gate 302. The bridge electrode 101 may be formed by reusing the source and drain metal layer, that is, the bridge electrode 101 is arranged at the same metal layer as the source 303 and the drain 304. The first power supply line 102 and the detection line 103 are arranged at the same metal layer, and may be formed by reusing the third metal layer 305.

In addition, in a case that the array substrate includes the second heat conductive sheet. That is, the frame region includes multiple second heat conductive sheets 30, the bridge electrode 101 is formed by reusing the source and drain metal layer, and the first heat conductive sheet 20 is formed by reusing one of the gate metal layer and the third metal layer, and the second heat conductive sheet 30 is formed by reusing the other one of the gate metal layer and the third metal layer. That is, the bridge electrode 101 is arranged in a metal layer between the first heat conductive sheet 20 and the second heat conductive sheet 30 to ensure the temperature uniformity of the region corresponding to the bridge electrode 101.

Figure 5:
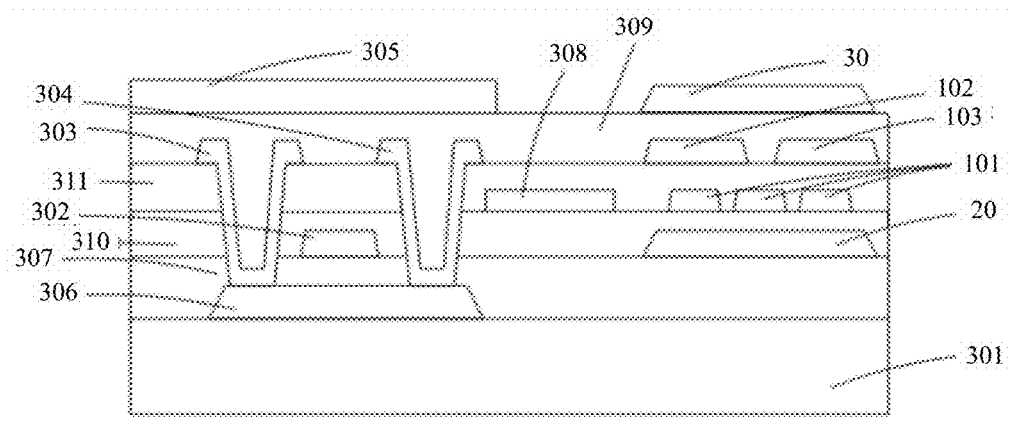
FIG. 5 is a schematic structural diagram of an array substrate according to an embodiment of the present disclosure.

In a case that the array substrate includes the second heat conductive sheet, the array substrate according to the embodiment of the present disclosure may further include an auxiliary metal layer, and the bridge electrode, the first power supply line and the detection line, the first heat conductive sheet, and the second heat conductive sheet may be formed through the gate metal layer, the source and drain metal layer, the third metal layer, and the auxiliary metal layer. Reference is made to FIG. 5, which is a schematic structural diagram of an array substrate according to an embodiment of the present disclosure. The array substrate further includes an auxiliary metal layer 308. The auxiliary metal layer 308 is arranged between the gate metal layer and the source and drain metal layer, and arranged to be isolated from the gate metal layer and the source and drain metal layer. Specifically, the auxiliary metal layer 308 is isolated from the gate metal layer through the first insulating layer 310, and the auxiliary metal layer 308 is isolated from the source and drain metal layer through the second insulating layer 311.

The frame region includes multiple second heat conductive sheets 30. The bridge electrode 101 is formed by reusing the auxiliary metal layer 308. The first power supply line 102 and the detection line 103 are formed by reusing the source and drain metal layer. The first heat conductive sheet 20 is formed by reusing one of the gate metal layer and the third metal layer, and the second heat conductive sheet 30 is formed by reusing the other one of the gate metal layer and the third metal layer. Optionally, since the auxiliary metal layer 308 is used to form the bridge electrode 101, the auxiliary metal layer may be a metal layer which is made of a high resistance material. Specifically, the auxiliary metal layer 308 is made of molybdenum metal.

It should be noted that, the array substrate according to the embodiment of the present disclosure may be a low-temperature poly-silicon TFT (Thin Film Transistor) array substrate. The array substrate includes at least one capacitor, and one plate of the capacitor is formed by the auxiliary metal layer. The capacitor may be a storage capacitor in a gate driving circuit. Alternatively, in a case that the array substrate is an array substrate of an organic electroluminescent display device, the capacitor is a capacitor in a pixel circuit of the array substrate, which is not specifically limited in the present disclosure, and the above description is only to indicate that the auxiliary metal layer may also be the original film layer on the array substrate.

Figure 6:
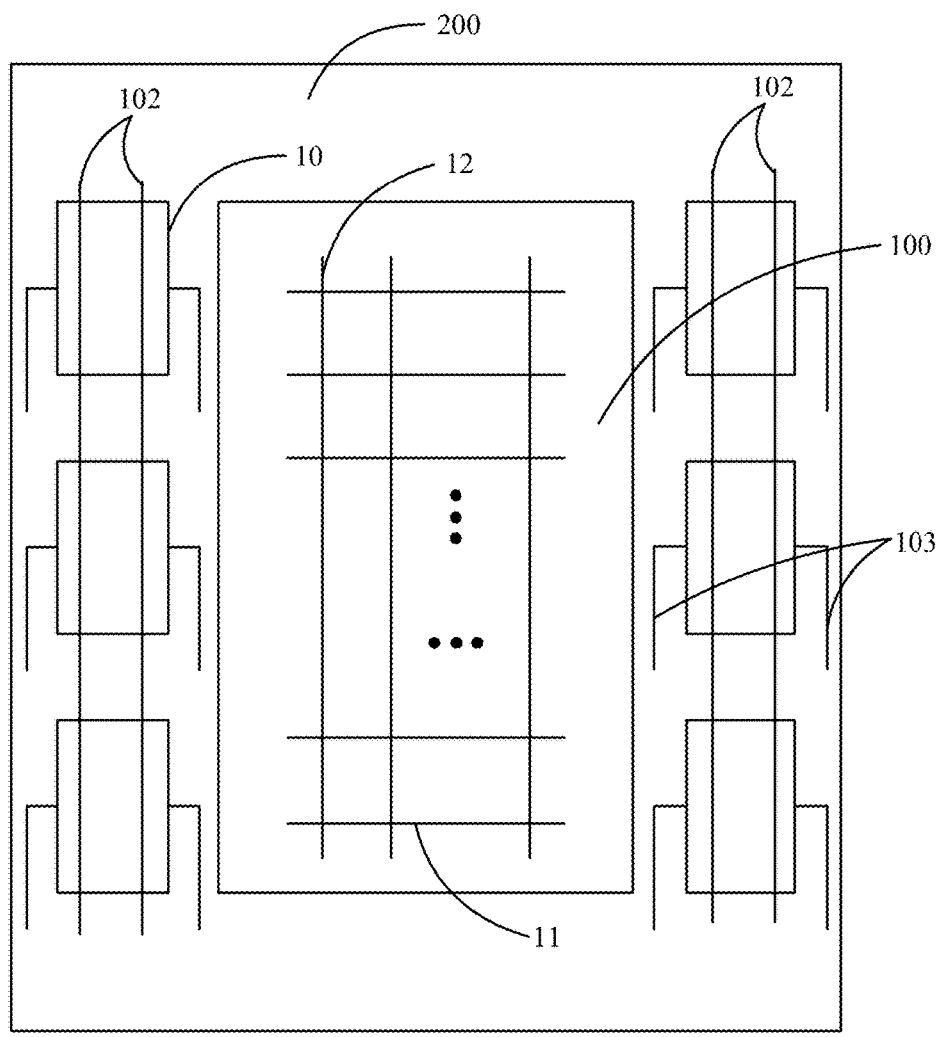
FIG. 6 is a schematic structural diagram of an array substrate according to an embodiment of the present disclosure.

Reference is made to FIG. 6, which is a schematic structural diagram of an array substrate according to an embodiment of the present disclosure. The display region 100 includes multiple gate lines 11 and multiple data lines 12, and multiple bridge pressure sensing units 10 are mirror-symmetrically arranged on both sides of the display region 100. Optionally, all of the bridge pressure sensing units 10 on the same side of the display region 100 are arranged in an extension direction of the data lines 12, and the first power supply lines 102 of all of the bridge pressure sensing units 10 on the same side of the display region 100 are the same line. It should be noted that, the pressure sensing units in the embodiment of the present disclosure may also be arranged only on one side of the display region. Alternatively, the multiple bridge pressure sensing units are asymmetrically arranged on both sides of the display region. In other embodiments of the present disclosure, the first power supply lines of the bridge pressure sensing units on the same side of the display region may also share the same line, which is not limited in the present disclosure and is determined according to specific situations.

A display panel is further provided according to an embodiment of the present disclosure. The display panel includes an array substrate according to any of the above embodiments.

It should be noted that, the display panel according to one embodiment of the present disclosure may be a liquid crystal display panel, or an organic electroluminescent display panel, which is not specifically limited in the present disclosure.

In addition, the display panel according to one embodiment of the present disclosure may further include a display unit and a second power supply line configured to power the display unit. The first power supply line and the second power supply line are electrically connected to the same potential.

It should be noted that, the display unit according to one embodiment of the present disclosure includes a gate driving circuit and a driving chip. In a case that the display panel is an organic electroluminescent display panel, the display unit further includes a pixel circuit or the like, which is the same as the conventional technology and is not redundantly described herein. In addition, the second power supply line according to the embodiment of the present disclosure includes two power supply sub-lines, which are respectively connected to a positive voltage terminal and a negative voltage terminal. That is, the two power supply sub-lines are respectively connected to a high potential and a low potential. The second power supply line and the first power supply line according to the embodiment of the present disclosure may be connected to the same potential. That is, one of the two power supply sub-lines of the first power supply line may be connected to a same high potential port as one of the two power supply sub-lines of the second power supply line. For example, the high potential port may be a power supply port of VDD line in an OLED panel. The other of the two power supply sub-lines of the first power supply line may be connected to a same low potential port as the other of the two power supply sub-lines of the second power supply line. For example, the low potential port may be a power supply port of VEE line in the OLED panel. In the above embodiment of the present disclosure, the number of ports of the structure of a driving circuit may be saved. The original power supply potential in the display panel can be used to power the bridge pressure sensing unit without an additional power supply potentials and power supply modules, which saves the cost.

A display device is further provided according to an embodiment of the present disclosure. The display device includes a display panel according to any of the above embodiments.

Figure 7:
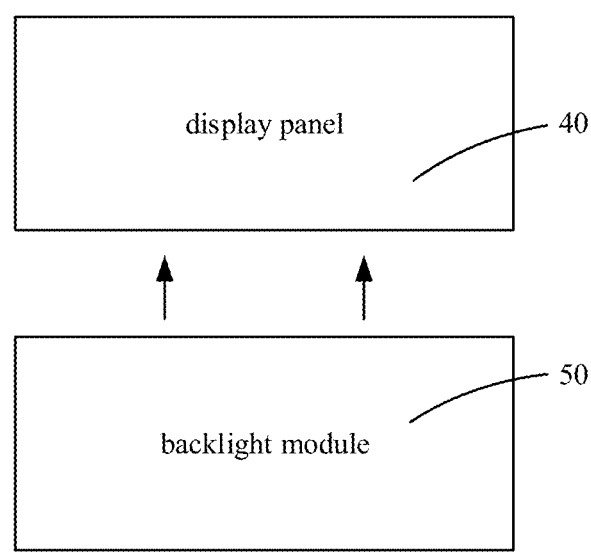
FIG. 7 is a schematic structural diagram of a display device according to an embodiment of the present disclosure.

Reference is made to FIG. 7, which is a schematic structural diagram of a display device according to an embodiment of the present disclosure. In a case that the display device is a liquid crystal display device, the display device includes a display panel 40 according to any of the above embodiments, and a backlight module 50 providing a backlight (as shown by the arrow in FIG. 7) to the display panel 40.

In addition, the display device according to the embodiment of the present disclosure may be an organic electroluminescent display device, which is not specifically limited in the present disclosure.

An array substrate, a display panel and a display device are provided according to the embodiments of the present disclosure. The array substrate includes the display region and the frame region surrounding the display region. The frame region includes multiple bridge pressure sensing units and multiple first heat conductive sheets. Each of the multiple bridge pressure sensing units includes a bridge electrode, a first power supply line electrically connected to the power supply terminal of the bridge electrode, and the detection line electrically connected to the detection terminal of the bridge electrode. Each of the multiple first heat conductive sheets is arranged opposite to the bridge electrode, and the vertical projection of the first heat conductive sheet on the bridge electrode covers the bridge electrode.

As can be seen from the above that, based on the technical solutions according to the present disclosure, the first heat conductive sheet is arranged opposite to a region where the bridge electrode is arranged, and the vertical projection of the first heat conductive sheet on the bridge electrode covers the bridge electrode. Since the heat conductivity of the first heat conductive sheet makes heat distribution of the first heat conductive sheet uniform, and further makes the temperature distribution of the region corresponding to the bridge electrode uniform, the influence of the non-uniform temperature on the output voltage of the bridge electrode is reduced, and a high accuracy of the pressure detection of the display device is ensured.

According to the description of the disclosed embodiments, the present disclosure can be implemented or used by those skilled in the art. Various modifications made to these embodiments may be obvious for those skilled in the art, and principles described in the present disclosure may be implemented in other embodiments without departing from the spirit or scope of the present disclosure. Therefore, the present disclosure is not limited to the embodiments described herein but conforms to the widest scope in accordance with principles and novel features disclosed in the present disclosure.

The invention claimed is:

1. An array substrate comprising:
 a display region;
 a frame region surrounding the display region, the frame region comprising:
 a plurality of bridge-type pressure sensing units, each of the plurality of bridge-type pressure sensing units comprising a bridge electrode, a first power supply line electrically connected to a power supply terminal of the bridge electrode, and a detection line electrically connected to a detection terminal of the bridge electrode;
 a plurality of first heat conductive sheets, in a one-to-one correspondence to the plurality of bridge-type sensing units, wherein each of the plurality of first heat conductive sheets is arranged opposite to the corresponding bridge electrode, and a vertical projection of each of the plurality of first heat conductive sheets on the corresponding bridge electrode covers the corresponding bridge electrode; and
 a plurality of second heat conductive sheets, in a one-to-one correspondence to the plurality of the bridge-type sensing units;
 a substrate;
 a gate metal layer arranged on a side of the substrate;
 a source and drain metal layer arranged on a side of the gate metal layer away from the substrate, and arranged to be isolated from the gate metal layer; and
 a third metal layer arranged on a side of the source and drain metal layer away from the substrate, and arranged to be isolated from the source and drain metal layer;
 wherein the plurality of the first heat conductive sheets is formed by reusing one of the gate metal layer and the third metal layer, and the plurality of the second heat conductive sheets is formed by reusing the other one of the gate metal layer and the third metal layer.

2. The array substrate according to claim 1, wherein each of the first power supply line and the detection line is arranged at a layer different from a layer where the bridge electrode is arranged, and is arranged opposite to the bridge electrode, and
 each of the first power supply line and the detection line is electrically connected to the bridge electrode via a through-hole, and vertical projections of the first power supply line and the detection line on the bridge electrode cover the bridge electrode to the maximum extent.

3. The array substrate according to claim 2, wherein the first power supply line and the detection line are arranged at the same layer.

4. The array substrate according to claim 1, wherein each of the plurality of second heat conductive sheets is arranged at a layer different from a layer where the corresponding bridge electrode is arranged, and arranged on a side of the corresponding bridge electrode away from the plurality of first heat conductive sheets, and a vertical projection of each of the plurality of second heat conductive sheets on the corresponding bridge electrode covers the corresponding bridge electrode.

5. The array substrate according to claim 1, wherein the bridge electrode is formed by reusing the source and drain metal layer.

6. The array substrate according to claim 1, further comprising:
an auxiliary metal layer arranged between the gate metal layer and the source and drain metal layer, and arranged to be isolated from the gate metal layer and the source and drain metal layer.

7. The array substrate according to claim 6, wherein the bridge electrode is formed by reusing the auxiliary metal layer, and the first power supply line and the detection line are formed by reusing the source and drain metal layer, the first heat conductive sheet is formed by reusing one of the gate metal layer and the third metal layer.

8. The array substrate according to claim 6, wherein the auxiliary metal layer is made of molybdenum metal.

9. The array substrate according to claim 6, wherein the array substrate is a low-temperature poly-silicon thin film transistor (TFT) array substrate, the array substrate comprises at least one capacitor, and one plate of the capacitor is formed by the auxiliary metal layer.

10. The array substrate according to claim 1, wherein the third metal layer is an anode metal layer or a common electrode layer.

11. The array substrate according to claim 1, further comprising:
a semiconductor layer arranged between the substrate and the gate metal layer, wherein a gate dielectric layer is arranged between the semiconductor layer and the gate metal layer; or
a semiconductor layer arranged between the gate metal layer and the source and drain metal layer, wherein a gate dielectric layer is arranged between the semiconductor layer and the gate metal layer.

12. The array substrate according to claim 1, wherein the display region comprises a plurality of gate lines and a plurality of data lines, and the plurality of bridge-type pressure sensing units are mirror-symmetrically arranged on both sides of the display region.

13. The array substrate according to claim 12, wherein all of the bridge-type pressure sensing units on the same side of the display region are arranged in an extension direction of the data lines, and the first power supply lines of all of the bridge-type pressure sensing units on the same side of the display region are the same line.

14. A display panel, comprising the array substrate according to claim 1.

15. The display panel according to claim 14, wherein the display panel is a liquid crystal display panel, or an organic electroluminescent display panel.

16. The display panel according to claim 14, further comprising:
a display unit; and
a second power supply line configured to power the display unit, wherein
the first power supply line and the second power supply line are electrically connected to the same potential.

17. A display device comprising a display panel, wherein the display panel comprises an array substrate according to claim 1.

18. An array substrate comprising:
a display region; and
a frame region surrounding the display region, the frame region comprising:
a plurality of bridge-type pressure sensing units, each of the plurality of bridge-type pressure sensing units comprising a bridge electrode, a first power supply line electrically connected to a power supply terminal of the bridge electrode, and a detection line electrically connected to a detection terminal of the bridge electrode;
a plurality of first heat conductive sheets, in a one-to-one correspondence to the plurality of bridge-type sensing units, wherein each of the plurality of first heat conductive sheets is arranged opposite to the corresponding bridge electrode, and a vertical projection of each of the plurality of first heat conductive sheets on the corresponding bridge electrode covers the corresponding bridge electrode; and
a plurality of second heat conductive sheets, in a one-to-one correspondence to the plurality of the bridge-type sensing units, wherein each of the plurality of second heat conductive sheets is arranged at a layer different from a layer where the corresponding bridge electrode is arranged, and arranged on a side of the corresponding bridge electrode away from the plurality of first heat conductive sheets, and a vertical projection of each of the plurality of second heat conductive sheets on the corresponding bridge electrode covers the corresponding bridge electrode.

19. An array substrate comprising:
a display region;
a frame region surrounding the display region, the frame region comprising:
a plurality of bridge-type pressure sensing units, each of the plurality of bridge-type pressure sensing units comprising a bridge electrode, a first power supply line electrically connected to a power supply terminal of the bridge electrode, and a detection line electrically connected to a detection terminal of the bridge electrode;
a plurality of first heat conductive sheets, in a one-to-one correspondence to the plurality of bridge-type sensing units, wherein each of the plurality of first heat conductive sheets is arranged opposite to the corresponding bridge electrode, and a vertical projection of each of the plurality of first heat conductive sheets on the corresponding bridge electrode covers the corresponding bridge electrode;
a substrate;
a gate metal layer arranged on a side of the substrate;
a source and drain metal layer arranged on a side of the gate metal layer away from the substrate, and arranged to be isolated from the gate metal layer; and
a third metal layer arranged on a side of the source and drain metal layer away from the substrate, and arranged to be isolated from the source and drain metal layer;
wherein the bridge electrode is formed by reusing one of the gate metal layer, the source and drain metal layer and the third metal layer, and the plurality of first heat conductive sheets is formed by reusing another one of the gate metal layer, the source and drain metal layer and the third metal layer other than the one reused to form the bridge electrode.

* * * * *